United States Patent [19]

Kudo

[11] 4,329,195
[45] May 11, 1982

[54] LATERAL PULLING GROWTH OF CRYSTAL RIBBONS

[75] Inventor: Bosshi Kudo, Nagareyama, Japan

[73] Assignees: Mitsubishi Kinzoku Kabushiki Kaisha; Toyo Silicon Co., Ltd., both of Tokyo, Japan

[21] Appl. No.: 863,480

[22] Filed: Dec. 22, 1977

Related U.S. Application Data

[63] Continuation of Ser. No. 705,353, Jul. 14, 1976, abandoned.

[30] Foreign Application Priority Data

Jul. 28, 1975 [JP] Japan ................................ 50-91099
Aug. 20, 1975 [JP] Japan ................................ 50-100112
Nov. 14, 1975 [JP] Japan ................................ 50-136840
Jan. 22, 1976 [JP] Japan ................................ 51-5462
Jan. 28, 1976 [JP] Japan ................................ 51-7474

[51] Int. Cl.² ............................................ B01J 17/18
[52] U.S. Cl. .................... 156/617 SP; 156/DIG. 97
[58] Field of Search ............... 156/DIG. 97, DIG. 88, 156/617 SP

[56] References Cited

U.S. PATENT DOCUMENTS 3,124,489 3/1964 Vogel ......................... 156/DIG. 96
3,293,002 12/1966 Spielmann ................... 156/DIG. 88
3,370,927 2/1968 Faust ........................... 156/DIG. 97
3,759,671 9/1973 Bleil ............................ 156/DIG. 97

FOREIGN PATENT DOCUMENTS 1130414 5/1962 Fed. Rep. of Germany ...... 156/617 SP

OTHER PUBLICATIONS

Bleil, Journal of Crystal Growth, 5 (1969), pp 99–104.

Primary Examiner—Hiram H. Bernstein
Attorney, Agent, or Firm—Frishauf, Holtz, Goodman & Woodward

[57] ABSTRACT

The lateral pulling growth of a crystal ribbon is established under precise heat control by pulling laterally the crystal ribbon from the melt of a crystalline substance having the same crystal structure as that of the crystal ribbon.

31 Claims, 11 Drawing Figures

LATERAL PULLING GROWTH OF CRYSTAL RIBBONS

This is a continuation of application Ser. No. 705,353, filed July 14, 1976 and now abandoned.

BACKGROUND OF THE INVENTION

Recently, there has arisen a great demand for a way to produce wide thin ribbons of single crystal of good quality at high speed. Such crystal ribbons are used as a semiconducting material, e.g. silicon crystal or Group IV element crystal, or III–V or II–IV compound crystal, or as an insulating material, e.g. sapphire. The demand for such material is increasing due not only to an increasing use of semiconducting devices, such as diodes, transistors, integrated circuits, etc., but also because they are used for solar batteries which are now being developed extensively for the purpose of utilizing solar energy.

For these purposes, thin ribbons of single crystal are desirable, since they will eliminate the step of slicing rod-shaped crystals and make possible a continuous production line from the preparation of a crystalline material to the processing of a device to be made thereof.

In the conventional art, the crystalline material to be used as mentioned above is crystallized in the form of a cylindrical rod and then is sliced into wafers.

Before now, many different processes have been proposed for the production of crystal ribbons. However, in such a conventional process, for example in the Dendrite process, though high speed production of crystal ribbons (up to 300 mm/min) is possible, many defects or disadvantages are found; the resultant crystal ribbon is of narrow width, and inevitably includes such gross crystal defects as twin lamellae and locally-concentrated impurities. In another conventional process, e.g. the Non-Dendrite process or the EFG process, the crystal ribbons obtained are wider and have fewer defects but the rate of crystal growth is slower than in the Dendrite process. The Web process has also been proposed but is very complicated and too delicate to effect stable crystal growth. Thus, none of the conventional processes are practical for the production of a thin crystal ribbon, particularly of single crystal on a commercial scale.

Recently U.S. Pat. Nos. 3,681,033 and 3,031,275 have proposed the horizontal growth of crystal ribbons. The U.S. Pat. No. 3,681,033 granted to Bleil discloses a method of horizontally growing a crystal ribbon from a seed crystal, which comprises maintaining a melt of a crystalline substance in a crucible with the height of the melt kept above the edge of the crucible, holding the seed crystal in contact with the surface of said melt to melt the surface of the seed slightly, and then horizontally pulling said seed while contacting the upper surface of the growing crystal ribbon with a solid heat sink thereby to produce a flat crystalline ribbon of predetermined thickness. According to this process, the solidification heat generated at the crystal growing interface between the crystal body and the melt as the crystal is growing is removed perpendicularly from the upper surface of the speed and crystal ribbon grown, and thereby a thin and wide-spread cooling surface layer is easily formed on the surface of the melt. Thus, in the cases of ice and Ge, crystal ribbons of relatively large width are obtained rather successfully. However, this process uses a solid body as a heat sink, and it results in variation of cooling effect and size of crystal ribbon due to the imperfect solid-solid contact, and, moreover, is not so practical nor effective as to realize fast crystallization of ribbons. The horizontal crystal growth technique, therefore, has never been practiced on a commercial scale, because of the lower quality of the resultant crystal ribbon compared to that of the conventional ones and the low growth rate.

Bleil also suggests in another paper "soft" cooling through radiation only or by means of a gaseous medium or a liquid medium for the purpose of realizing uniform crystal growth, but says nothing about how to increase the rate of crystal growth. It is supposed that the crystal growth velocity of the Bleil patent is about 3 mm/min at the most.

In addition, in the conventional horizontal crystal growth, not so much importance was placed on the distance between the crystal growing interface and the heating surface of a heating means which heats the crystal growing interface from the side of the melt. The distance was not less than $\frac{1}{4}$ inches (e.g. see U.S. Pat. No. 3,681,033 to Bleil). Therefore, the conventional horizontal crystal growth process was practiced under conditions resulting in very large time delays in compensating for the variation or fluctuation of temperatures at the crystal growing interface, and it was difficult to keep the temperature within a very small tolerance. This is essentially required for adjusting the crystal ribbon to predetermined shape and size. Thus, in my experiments using this method the crystal ribbons produced vary widely in width, thickness and surface flatness. The density of dislocations found in the crystal is very high and sometimes gross defects such as twin planes are also found in the crystal. Namely, the crystallinity obtained is not satisfactory. Many other disadvantages are also experienced, e.g. extremely low yield, complicated procedures for crystal growth, frequent interruption of the process, etc.

BRIEF DESCRIPTION OF THE INVENTION

It is a primary object of the present invention to provide a method for producing wide and thin crystal ribbons at unexpectedly high speed.

It is a secondary object of the present invention to provide a reproducible method for preparing wide and thin crystal ribbons with high yield.

It is another object of the present invention to provide a method for producing wide and thin crystal ribbons of good crystallinity and of precise geometry at high speed and with high yield.

It is still another object of the present invention to provide a method for producing wide and thin crystal ribbons, which can eliminate the prior art disadvantages mentioned hereinbefore.

It is a further object of the present invention to provide a practical process for producing wide and thin crystal ribbons, which is easily operated manually and easily converted to automatic operation and control.

The other objects and advantages of the present invention will be apparent from the following description of the invention and the preferred embodiments of the invention.

DETAILED DESCRIPTION OF THE INVENTION

According to the present invention, wide and thin crystal ribbons are obtained at high speed through a lateral pulling growth process, in which temperature conditions at the crystal growing interface are so adjusted by means of heating with a heating means and cooling with a cooling means that a crystal growing domain may spread widely. The cooling is achieved by means of natural radiative dissipation and/or a gaseous coolant, such as hydrogen or argon gas, which is blown over the upper surface of the crystal growing domain through a plurality of nozzles provided overhead. Thus, according to the present invention, the lateral pulling growth is realized at unexpectedly high speed. The crystal growing domain in section is a wedge-shaped crystal portion which extends from the front of the crystallized body, where the crystal growth begins, to the back of the crystallized body, where the thickness of the growing crystal reaches a target final value.

In one aspect of the invention, the distance "L" between the front edge and the back edge is adjusted to not less than 5.7 times the thickness "t" of the crystal ribbon, i.e. the angle between the crystal growing interface and the upper surface of the crystal ribbon is adjusted to not more than 10 degrees. Thus, according to this feature of the invention, the cooling area, i.e. the crystal growing interface, spreads sufficiently widely to more rapidly remove the heat of solidification thus making it possible to grow crystal at higher speed. The crystal ribbon may be pulled in the horizontal direction. The crystal ribbon may also be pulled at any angle with respect to the horizontal surface of the melt, as far as the ratio of L/t is adjusted to not less than 5.7.

The thickness "t" generally in the range of from 0.08 to 3 mm, preferably in the range of 0.1 to 1.0 mm. The distance L may extend from 5 mm to several meters. Therefore, the ratio L/T is 5.7 or more, usually 50 or more, and preferably 2,000 or more. A ratio of 20,000 or more may be expected.

The ratio of L/t is adjusted to a predetermined value by means of reducing the temperature in the surface area of the melt where the crystal is to be grown to a temperature below the melting point of the melt to form a supercooled layer extending in the crystal growth direction In this respect, the operation for producing the crystal ribbon in accordance with the invention will be further improved by pulling the crystal with the position of the back edge of the crystal growing domain located inside the line at which the crystallized ribbon is pulled apart from the melt. By employing this arrangement of the back edge, the crystal is provided from growing downwardly from the undersurface of the crystal ribbon being pulled.

In addition, I have found that the present invention method of lateral pulling growth becomes highly reproducible, that is, the process is easily practiced under control resulting in a remarkably high yield, by pulling the crystal ribbon at an angle of not greater than 10° upwardly from the horizontal free surface of the melt. Preferably, the crystal ribbon is pulled from an area of the melt inwardly away from the edge of the container of the melt at an angle of not greater than 10° upwardly from the horizontal melt surface.

Thus, in another aspect of the invention the crystal ribbon is pulled from the melt at an angle of not greater than 10 degress upwardly from the horizontal melt surface. One advantage of this method is that it becomes easy to maintain the isotherm in the melt substantially in parallel to the crystal growing interface. The crystal ribbon may also be pulled from an area of the melt inward and apart from the edge of the container of the melt. An additional advantage of this method is that the formation of a bridge sometimes found between the edge of the container and the undersurface of the ribbon can easily be prevented.

In these cases, if the ratio of L/t is adjusted to not less than 5.7, then the crystal ribbons may be produced at higher speed and with higher yield.

A combined process was found to be more effective, which comprises initially pulling the crystal ribbon from the melt at an angle of not greater than 10 degrees upwardly from the horizontal melt surface and gradually turning the pulling direction to the horizontal after the pulling rate reaches a predetermined level. In this case, too, it is preferable to maintain the ratio of L/t to not less than 5.7.

I have further discovered that the contour of the front edge of the crystal growing domain significantly affects the quality of the resulting crystal ribbons. It was found that in the process of the lateral pulling growth of crystal ribbons, there is little or no dislocation found in the crystal ribbons, if the contour of the front edge is so defined that there is no concave portion on the front edge facing the crystal growing direction, that is, if the front edge is so adjusted as to define a straight line or a convex curve with respect to the crystal growing direction. More strictly speaking, the contour is defined in such a manner that there are no edge portions advanced in the crystal growth direction from any point on both sides of the front edge divided by the point. The preferred contour of the front edge is a straight line perpendicular to the direction of crystal growth. The contour may be adjusted by means of elevating the temperature in the surface area of the melt surrounding the crystal growing domain above the melting point of the crystal.

Thus, according to the lateral pulling growth of the crystal ribbons mentioned above, flat surface ribbons of single crystal having little or no dislocation therein are obtained.

In this case, too, the ratio of L/t may be adjusted to not less than 5.7.

In another aspect of the invention, a heating means is provided, which has a heating surface substantially in parallel to the crystal growing interface, preferably at a distance of not more than 30 mm from the crystal growing interface. A desirable crystal growing interface can be maintained without a time lag by adjusting the heating means suitably. In this method the heating means has a heating surface substantially in parallel to the crystal growing interface; therefore, wide and thin crystal ribbons of good quality are obtained at high speed and with high yield. In this method, too, the crystal may be pulled from the melt at an angle of not greater than 10 degrees upwardly from the horizontal melt surface, the ratio of L/t may be adjusted to not less than 5.7, and the contour of the front edge may be defined as described above.

In summary, the present invention provides a method for laterally growing a thin crystal ribbon, characterized in that the crystal ribbon is laterally pulled from the melt of a crystalline substance having the same crystal structure as that of the crystal ribbon and the ratio of the distance from the front edge F to the back edge B of the crystal growing domain to the thickness of said crystal ribbon is adjusted to not less than 5.7, by means of reducing the temperature in the surface area of the melt where the crystal is to be grown to a temperature below the melting point of the melt to form a supercooled layer extending in the crystal growth direction.

The present invention also provides a method for laterally growing a thin crystal ribbon, characterized in that the crystal ribbon is pulled from the melt of a crystalline substance having the same crystal structure as that of the crystal ribbon at an angle of not greater than 10 degrees upwardly from the horizontal melt surface.

The present invention also provides a method for laterally growing a thin crystal ribbon, characterized in that the crystal ribbon is laterally pulled from the melt of a crystalline substance having the same crystal structure as that of the crystal ribbon and that the contour of the front edge is adjusted to a shape which is defined in such a manner that there are no edge portions advanced in the crystal growth direction from any point on both sides of the front edge divided by the point by means of raising the temperature in the surface area of the melt surrounding the crystal growing domain to above the melting point of the crystal.

The present invention also provides a method for laterally growing a thin crystal ribbon, characterized in that the crystal ribbon is laterally pulled from the melt of a crystalline substance having the same crystal structure as that of the crystal ribbon and a heating means having a heating surface substantially in parallel to the crystal growing interface is provided beneath the crystal growing domain at a distance of not more than 30 mm.

Any combination of these novel methods of the present invention, as is apparent from the description given hereinbefore, falls within the spirit and scope of the invention and the appended claims.

BRIEF DESCRIPTION OF THE DRAWINGS

FIG. 4b shows an isothermal plane configuration of FIG. 4a;

PREFERRED EMBODIMENT OF THE INVENTION

Figure 1:
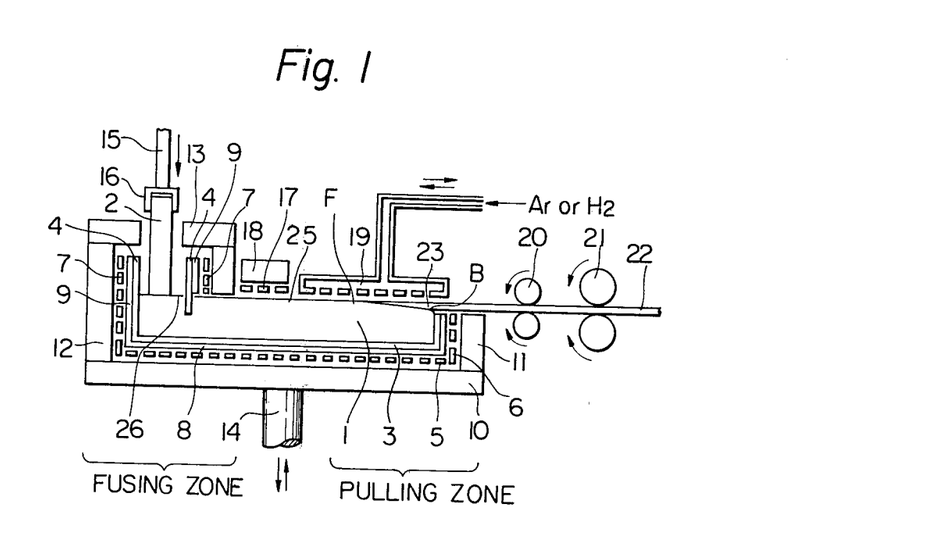
FIG. 1 is a sectional view which shows the structure of an apparatus for producing crystal ribbons in accordance with the method of the present invention.

FIG. 1 shows the structure of an apparatus in which the crystallized ribbon is pulled out of the crucible in accordance with the lateral pulling crystal growth technique of the present invention.

The end product crystal ribbon 22 is laterally pulled from the melt 1 of a crystalline material at the pulling port 23 on the same level as the free liquid surface of the melt. The melt 1 is held near the temperature of the melting point of the crystalline material by means of a heating apparatus of the electric resistance or r.f. induction type, to which power is supplied through an electric source (not shown). The surface of the melt 1 is maintained horizontal and stable within the crucible 3. The height of the crucible is, at least at the pulling port, lower than the height of the melt 1, so that the seed crystal and crystallized body may be withdrawn without contacting the edge of the crucible. The material of the crucible must be one that does not react with the melt, does not contaminate the melt and does not show wettability to the melt. For example, in the case of the crystal ribbon of semiconductive silicon, the crucible should be made of high purity quartz or high purity silicon. With any material used, the surface of the melt can be held up to about 10 mm higher than the edge of the crucible at least at the pulling port. When high purity quartz, which softens at an elevated temperature, is used, it is preferable to place the crucible 3 within the crucible 8 of high purity graphite.

Since the melt 1 is consumed in producing the crystal ribbon, it is necessary to supply the material to the crucible. For this purpose, for example, the polycrystalline silicon rod 2 hung from shaft 15 through holding means 16 is brought down into the melt. The bottom end of the rod is heated above the melting point of the crystalline material within the quartz crucible 4 (and graphite crucible 9) by means of heating means 7 of the electric resistance or r.f. induction type, to which electric power is supplied from an electric source (not shown). Thus, the liquid level of the melt 1 is maintained at a given level. Of course, when starting the process, the crystalline material may be heated and fused in the same manner. The temperature in the fusing zone in which the heat of fusion is required is higher than in the pulling zone. In the case of silicon, the silicon evaporated from the melt is precipitated as SiO or amorphous silicon onto the surface of the inner wall of crucible 4 and the rod 2 etc. These solid precipitates fall onto the surface of the melt 1 to provide floating solids 26, which sometimes may reach the pulling zone to cause an abnormal crystal growth. Therefore, a separating wall, a part of crucible wall 4 is provided so that floating solids 26 are prevented from going to the melt surface of the pulling zone. The immersed separating wall of crucible 4 also serves to prevent vibrations of the melt surface in thr fusing zone from travelling to the pulling zone.

While maintaining the surface level constant, the temperature of the resulting melt surface is adjusted to a predetermined level by means of heater 17 (top-heater) in the area of temperature control zone 25 in front of the front edge of the crystal growing domain where the crystal is grown. Then, the melt is supercooled with a gas cooler 19 made of quartz by blowing over the domain an inert gas coolant, such as argon or helium gas, at a controlled flow rate through the nozzles. A supercooled surface layer having a temperature slightly lower than the melting point (1420° C. for silicon) is formed on the surface of the melt. In accordance with the invention a suitable thermal balance is established by suitably adjusting cooling with cooler 19 and heating with the heating means 5 provided underneath the melt. Namely, the ratio of the distance from the front edge F to the back edge B of the crystal growing domain to the thickness of the crystal ribbon may be adjusted by means of reducing the temperature in the surface area of the melt where the crystal is to be grown to a temperature below the melting point of the melt to form a supercooled layer extending in the crystal growth direction.

A ribbon-form seed crystal having the same crystal structure as the material to be crystallized, which is, for example, in case of semiconductive silicon, a single crystal seed fabricated in the form of a thin plate with the principal plane of {111} and the longitudinal axis of <211>, is immersed into this layer and melted back. At this time crystallization occurs at the crystal growing interface, which acts as a nucleus for crystal growth. The seed crystal is thereafter laterally pulled continuously in the longitudinal direction through a pulling mechanism including guide rollers 20, 21 made of graphite and drive rollers (not shown) having coatings of silicone rubber. The crystal which has grown in the crystal growing domain is pulled and is kept at an angle or on the same level as the melt surface by the guide rollers. And then the ribbon of single crystal sufficiently cooled is drawn from the system through the drive rollers driven by a motor (not shown).

Figure 2:
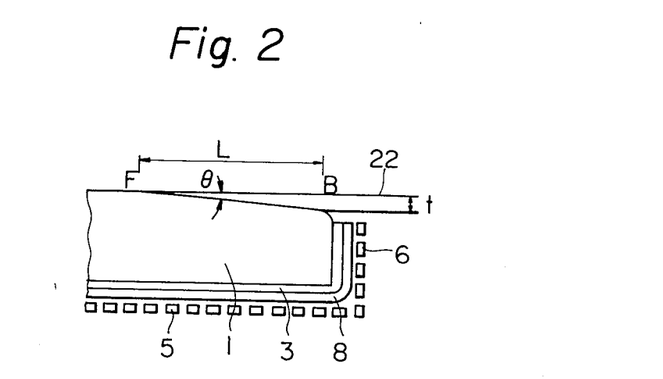
FIG. 2 is an enlarged fragmentary view of FIG. 1, which shows the crystal growing domain in the shape of a wedge increasing in thickness in a direction from the front edge F to the back edge B.

A vertical section of the crystal growing domain formed during the pulling of the crystal is shown in FIG. 2, in which the thickness of the domain becomes increasingly larger as it goes from the front edge F to the back edge B in the direction of pulling. It is possible to form a coding layer, i.e. the crystal growing domain having a solidifying isotherm of a wide area, which is at constant depth in a section perpendicular to the pulling direction, and which is zero in depth at the front edge and gradually increases its depth as it goes toward the pulling port (see FIG. 2).

In accordance with the invention high speed production of crystal ribbon is realized under a suitable thermal balance established by adjusting the cooling with cooler 19 and heating of the melt. For this purpose, the ratio of the distance from the front edge F to the back edge B of the crystal growing domain to the thickness of the crystal ribbon may be adjusted by means of reducing the temperature in the surface area of the melt where the crystal is to be grown to a temperature below the melting point of the melt to form a supercooled layer extending in the crystal growth direction.

More specifically, in the method of the present invention, for example, by shifting the cooling means 19 in the direction against the pulling direction of the crystal ribbon, the distance L between the front edge F and the back edge B may be adjusted to 5.7 or more times the thickness "t" of the crystal ribbon pulled out of the system. That is, in the case of FIG. 1, the angle of the crystal growing interface with respect to the upper surface of the seed and grown crystal is adjusted to not greater than 10 degrees.

The effects derived from increasing the areas of crystal growing interface and crystal growing domain can be explained as follows.

Provided that a crystal ribbon in thickness t and width w is now growing at the pulling rate of rp, the total heat of solidification $Q_f$ generated at the crystal growing interface extending from the front edge F to the back edge B can be expressed by the following equation:

$$Q_f = r_p \cdot t \cdot w \cdot S_c \cdot q_s$$

(wherein $S_c$ is the specific gravity of the crystalline material, and $q_s$ is the heat of solidification per unit of weight of the crystalline material.)

Assuming that the angle $\theta$ of the crystal growing interface with respect to the horizon is very small, then the area of crystal growing interface S becomes substantially equal to the product of the length L of the growing domain and the width w of the ribbon. Therefore, the heat of solidification per unit of the area, $q_f$, can be expressed:

$$\begin{aligned} q_f &= Q_f/S \\ &= r_p \cdot t/L \cdot S_c \cdot q_s \\ &= r_p \cdot \tan\theta \cdot S_c \cdot q_s \; (\tan\theta = t/L) \end{aligned}$$

As noted from the foregoing, it is necessary to thoroughly remove the heat $q_f$ from the crystal growing interface. Since the ability of a given cooling system to remove heat per unit of area has a limit, it is further necessary to make the angle $\theta$ smaller, i.e. to make the ratio of the length L to the thickness t larger so as to thoroughly remove the heat $Q_f$ with a given cooling system to grow the crystal at higher speed. Therefore, it is possible to remove substantially all of the heat $Q_f$ by adjusting the angle $\theta$ or the ratio L/t.

For example, according to one embodiment of the invention, in which semiconductive silicon ribbons 1 mm in thickness and 40 mm in width were grown, a high production speed of 300 mm/min was established with an $H_2$ gas coolant by adjusting the angle $\theta$ to 1°10′, i.e. the distance L to 50 mm. Such a high production rate has never been obtained by the conventional processes. The resultant single crystal is of high quality. This proves the effectiveness of the present invention process. In this respect, I have found that it is necessary to restrict the ratio of the distance L to the thickness "t" to not less than 5.7 in order to produce a crystal ribbon of high quality at a speed higher than that of the conventional processes. It is apparent that the present invention process may be practiced even in such a way that the pulling direction of the crystal ribbon is inclined upwardly or downwardly with respect to the horizontal.

Figure 3A:
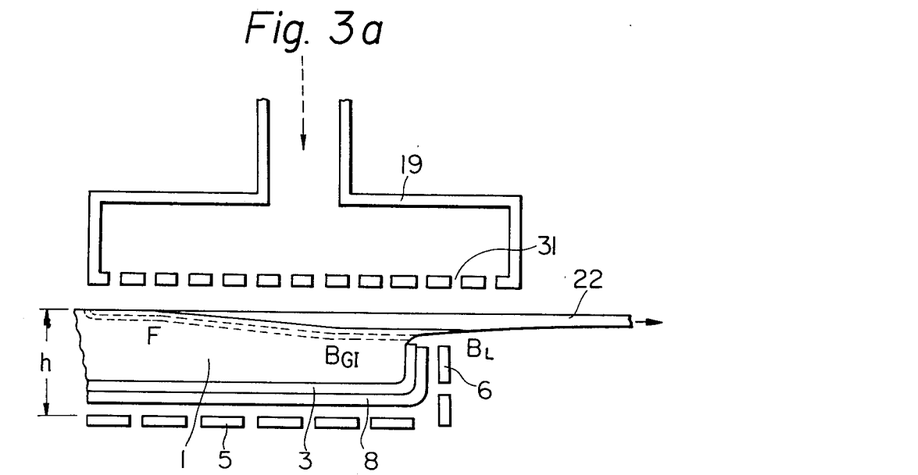
FIG. 3a is a view which diagrammatically explains the concept of the embodiment of the present invention, in which the ribbon of single crystal is growing at high speed without the downward growth of crystals.

The lateral pulling growth of crystal ribbons with a gaseous coolant provides high speed production of wide and thin crystal ribbons. However, it is even more important in the art for operators to produce the crystal ribbons consistently under controlled operation. Thus, I have found a highly reproducible process for the lateral pulling growth of crystal ribbons. FIG. 3a shows a vertical section of a part of the apparatus utilized in the present invention. As shown characteristically in FIG. 3a the crystal growing interface extends from the front edge F to the back edge $B_{GI}$ positioned inwardly away from the edge of the crucible with the thickness thereof increasing as it goes towards the back edge. The thickness of the growing crystal reaches its maximum at the back edge. Generally, the ratio of L/t is preferably adjusted to not less than 5.7. For this purpose, care should be taken on the arrangement of heating means 5 and cooling means and their heating and cooling rates to make the isothermal planes as flat as possible. However, in carrying out high speed production of the ribbon crystals the temperature of the interface will be dominated by the heat of solidification, since the solidifying heat becomes greater than the conductive heat supplied from the heating means as the production speed increases. For this reason, the heat of solidification generated in an area of a lower crystallizing velocity is smaller than that in an area of a higher crystallizing velocity, so that the velocity of crystal growth now becomes greater in the low crystallizing area than in the high crystallizing area, if the removal of heat is constant, resulting in the self-control of temperature at the crystal growing interface. Therefore, a uniform surface of the wedge-shaped portion of crystal is obtained without any difficulty.

Figure 3B:
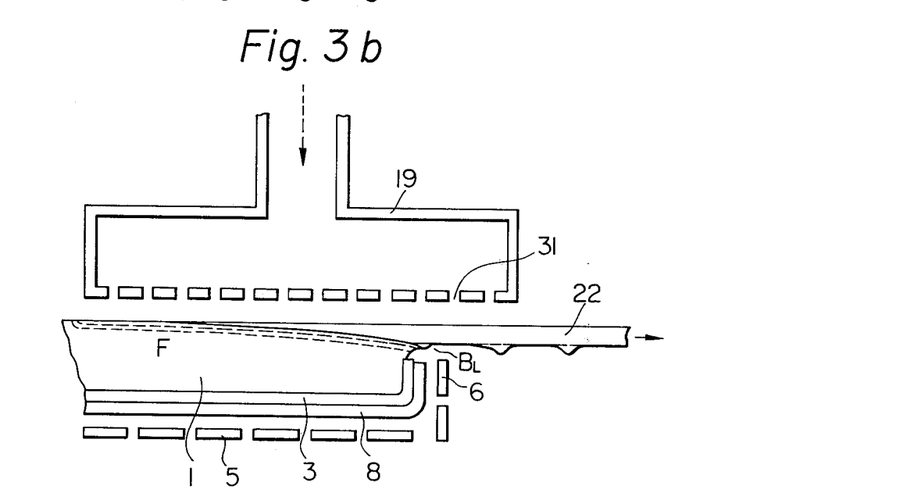
FIG. 3b shows diagrammatically the formation of downward growth of crystals.

However, as shown in FIG. 3b, a different pattern of temperature is found in the area from which the crystal leaves the melt. In such an area due to the easy dissipation of heat from the miniscus in the horizontal direction, the meniscus is cooled so much that the isothermal planes extending along the crystal growing interface bend downwardly resulting in thickening of that part of the crystal. So, at a low rate of pulling, under such situation, the crystal drags a portion of the melt outward from the meniscus, which bulges out of the edge of the crucible, until the dragging strength becomes equal to the surface tension of the melt. When the dragging force overcomes the surface tension, the surface of the melt dragged breaks out and the meniscus recovers the form it had before, and the thickness of the crystal which has been covered with the dragged melt holds its desirable value. Since the same conditions are maintained in the area around the meniscus, the above process is repeated. Thus, the bottom surface of the crystal shows a periodic wave-like pattern on its face, which deforms the bottom surface to a point far beyond the acceptable limitation. Also, the yield decreases. In addition, the melt drawn up with the crystal falls down outside the crucible, and brings about rapid reduction of the liquid level of the melt within the crucible, and the operation has to be stopped due to such an accident.

In order to prevent such downward or wave-like growth mentioned above, the heating means is provided near the edge of the crucible and the heating with it is carefully adjusted so as to make up for the loss of heat in the horizontal direction.

When the crystal is pulled at a higher rate, the crystal growth in the vertical direction is prohibited without employing the heating means, because the high velocity crystal growth not only does not give the crystal a chance to grow in the vertical direction (i.e. downward growth), but also the rapid crytallization generates a large amount of heat which can make up for the heat dissipated from the meniscus in the horizontal direction.

Therefore, according to one embodiment of the present invention, the heating means 6 is provided as shown in FIG. 3a, in which a gaseous coolant is blown through nozzles 31 over the surface of the crystal ribbon 22 being pulled laterally. The position of the heating means and the heating with it are also adjusted so that the back edge $B_{GI}$ is located inwardly from the position BL from which the crystal ribbon leaves the melt 1. The interface between the crystal and melt in this area between the back edge $B_{GI}$ and the back line BL is kept substantially horizontal and the thickness of the crystal in this area is also kept constant. This can easily be established through heat control by means of the heating means 6.

According to this embodiment of the present invention process, even in this case, by adjusting the ratio of the distance between the front edge F and the back edge $B_{GI}$ of the crystal growing domain to the thickness t of the ribbon to 5.7 or more, the growth rate can be increased unexpectedly. So, actually, a semiconductive silicon was crystallized without any downward crystal growth from the bottom surface at a rate of 300–400 mm/min.

Figure 4A:
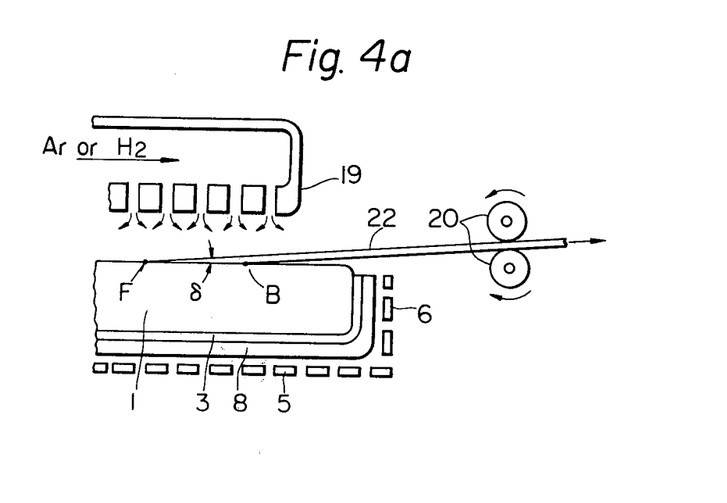
FIG. 4a is a partial sectional view which shows one embodiment of the present invention.
Figure 4B:
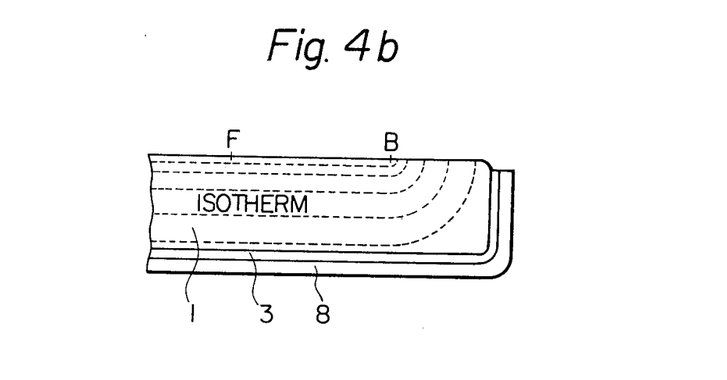

FIG. 4a shows another embodiment of the present invention, in which the surface of melt 1 is cooled by radiative dissipation or with blowing a coolant gas, Ar or $H_2$ through the cooler 19 over the surface of the melt and the crystal ribbon now being pulled and characteristically the pulling direction is not same but inclined upwardly to the horizon at an angle with respect to the free surface of the melt. As shown in FIG. 4b, the isotherm, in this case, extends substantially in parallel to the surface of the melt 1, and characteristically across the melt surface in the area extending from the edge of the crucible 3 to the position of the back edge B located sufficiently inwardly apart from the edge of the crucible. The supercooled layer is formed on the surface of the melt differently in position from the known horizontally-directed pulling. Such configuration can easily be established by adjusting the heating with the heating means 5 and 6 and the position of the cooling means 19 according to this embodiment. Thus, in accordance with this embodiment of the invention, a process for producing wide and thin crystal ribbons is unexpectedly stabilized. In this respect, I have found that the angle $\delta$ between the pulling direction and the melt surface should not be greater than 10 degrees.

In this process, the crystal growing interface may be in alignment with the horizontal surface of the melt 1. This can further improve the heat control of the crystal growing domain compared to the lateral pulling technique described hereinbefore, although the angle of the pulling direction with respect to the interface between the melt and the crystal is kept not greater than 10 degrees.

It is an additional advantage of this process that the melt surface may be as high as or lower than the edge of the crucible, as far as the crystal ribbon being pulled is not permitted to contact the edge of the crucible. This means that the crucible may be made of any material.

In addition, this process shown in FIG. 4a can eliminate the prior art disadvantage that a portion of the melt is dragged or drawn out with the crystal being pulled to result in dropping at last, which sometimes occurs in operating the conventional horizontal crystal growth. The operation of the present invention process, therefore, is very much stabilized without suffering the fracture of crucibles and the disturbance of the melt 1, which would result in degradation of structure and size of the crystal.

Another advantage of this FIG. 4a process is that the back edge B may be positioned in an area advanced inwardly of the edge of the crucible by upwardly inclining the pulling direction of the crystal ribbon. So, if the crystal ribbon is pulled in the horizontal direction i.e. in parallel to the surface of the melt, the crystal ribbon has to be pulled from the meniscus portion of the melt swollen from the edge of the crucible, and the position of the back edge B depends on the height of the meniscus and the strength of the surface tension. Previously it was limited to 5 mm at the most from the edge of the crucible. When the back edge B is positioned very near the edge of the crucible, it is rather difficult to maintain a desirable thermal condition between the back edge B and the edge of the crucible and sometimes a bridge-like crystal extending from the back edge to the crucible edge is formed. Contrary to the above, if the crystal ribbon is pulled at an angle with respect to the surface of the melt, it is possible to fix the back edge B more than 5 mm inwardly apart from the edge of the crucible. In this method, the thermal condition between the crucible edge and the back edge B is easily adjusted to provide a desirable thermal pattern by suitably arranging the pulling direction and cooling with the cooling means 19. The formation of a bridge, therefore, can easily be eliminated in accordance with this arrangement.

In one specific embodiment of the present invention method, the seed crystal, after being slightly dipped in the melt, is pulled at an angle with respect to the horizontal melt surface and then the ribbon crystallized is pulled increasingly at a higher rate and then the direction of pulling is lowered to the horizontal after reaching a predetermined pulling rate. This combination of processes can show remarkable effects.

Namely, when the crystal is not pulled or is pulled at a lower rate, it is so difficult to provide a desirable thermal pattern in a very short distance between the ribbon and the edge of crucible that bridges are frequently formed. According to this specific embodiment, however, such disadvantages are eliminated successfully by heating such an area with heating means 6. On the other hand, when the crystal is pulled at higher speed (e.g. hundreds of millimeters per minute), due to the large amount of heat generated at the crystal growing interface, the thermal condition near the pulling port is so stabilized that such bridges do not usually occur. So, in a high speed operation, the horizontal pulling which is preferable so as to realize a high growth rate according to the present invention and to control precisely the geometry of the grown ribbon crystal becomes highly practical.

In summary, this combined process can provide a practical process for producing wide and thin crystal ribbons at higher speed and with higher yield, without the disadvantages sometimes encountered at the starting of the high speed lateral pulling crystal growth operation.

Figure 5:
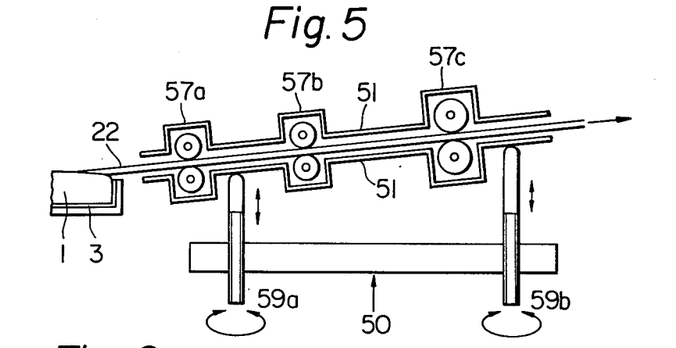
FIG. 5 shows in section a mechanism to adjust the pulling direction of crystal ribbon.

FIG. 5 shows the mechanism for pulling a crystal ribbon in a direction inclined at a small angle with respect to the horizon, i.e. the horizontal surface of the melt. The crystal ribbon 22 is pulled from the melt 1 of a crystalline material contained in crucible 3. The angle of the pulling direction with respect to the surface of the melt 1 is adjusted by means of a guide means 51 by adjusting the supporting rods 59a and 59b independently, which are, in turn, fixed through screws to the lateral plate 50 and are slidable up and down. The crystal ribbon is pulled into the guide means 51 through guide roller 57a and 57b and driving rollers 57c driven by a motor (not shown). Therefore, the direction of pulling of the crystal is easily fixed at any angle from 0° to 10° with respect to the horizontal surface by means of the pulling mechanism above.

As a person skilled in the art would easily anticipate, the pulling mechanism shown in FIG. 5 is particularly advantageous for the application of the combined process just hereinbefore described.

Now, as is generally known, it has been highly desired in the art to produce a crystal ribbon of a high quality at high speed and with high yield. According to my knowledge the peripheral shape of the crystal being grown at the crystal growing interface significantly affects the quality of the resulting ribbon crystals, including its dimension and crystallinity. That is, the contour of the front edge defining a part of the crystal growing interface is remarkably important in determining the quality of crystal ribbons. I have found that crystal ribbons of high quality are obtained by a lateral pulling crystal growth, if the contour of the front edge of the crystal growing interface is defined as that containing no concave portion facing in the direction of crystal growth; that is, it is comprised only of a straight line perpendicular to the direction of pulling of the crystal ribbon, or a line or a curve having no concave portion open in the direction of the crystal growth. More strictly speaking, the contour of the front edge is defined in such a manner that there are no edge portions advanced in the crystal growth direction from any point on both sides of the front edge divided by the point. This includes the cases in which the front edge is a straight line, or when the points on only one side of the line which divides the front edge at any advancing point of said front edge may go beyond said advancing point.

Figure 6A:
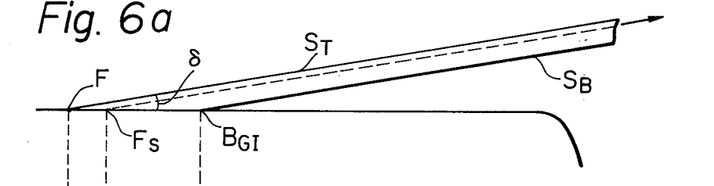
FIGS. 6a and 6b are schematic views which explain the formation and the contour of the front edge of the crystal growing domain.

FIG. 6a shows one embodiment of this method, in which the real line indicates the typical contour of a non-concave front edge. The dotted line indicates the case in which the front edge contains a concave portion therein. Specific width, length and peripheral shape in a plane view of the crystal growing domain depends on the thermal condition in the area around the domain. The temperature in this area is maintained at a higher level with a series of heating means made of high purity graphite, which are so arranged as to surround the domain and are positioned just over the melt surface and are independently controlled. The melt surface directly under these heating means is heated to a temperature higher than the solidifying point of the melt. Namely, the width of the crystal growing domain may be adjusted by the series of heating (not shown) provided along both sides of the domain in the direction of pulling. The positions of the front edge and the back edge may also be adjusted precisely by the heating means (not shown) provided near the front edge and the back edge.

In accordance with the present invention method in which the contour of the front edge of the crystal growing domain is so defined that it does not have any concave facing the direction of the crystal growth therein, the crystal growing at the front edge of the crystal growing domain may grow in any direction on either sides without any limitation as the crystal is pulled. Thus, the crystal which is growing does not incorporate any internal stress, and the dislocation is not generated nor multiplied. The resulting crystal shows a relatively low density of dislocations in the range of $10^3$ to $10^4/cm^2$.

In addition, it was found that when employing the high speed pulling technique, the resulting crystal does not have any dislocation due to the absence of internal stress within the crystal. Dislocation which might be introduced into the crystal due to temporary existance of an internal stress brought about accidentally when seeding etc. would disappear rapidly during the crystal growth.

Figure 6B:
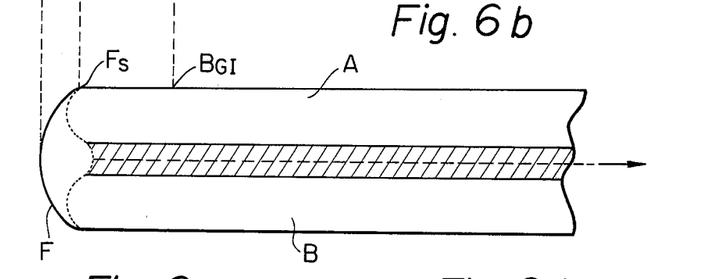

On the other hand, if any concave portion has been formed on the front edge of the crystal growing domain, e.g. due to unsuitable arrangement of the heating means provided near the front edge, the existence of two convex portions will result in the zones A and B (see FIG. 6b) which do not contain any dislocation therein for the reason mentioned hereinbefore, but the intermediate zone (hatched area in FIG. 6b) contains concentrated dislocations. The single crystals which grow at the front edges of both of the zones A and B grow in the direction toward to the center of the band of crystal and meet with each other in said intermediate zone, wherein the misfit of orientation between the crystals due to a small temperature difference has to be relaxed, resulting in a high density of dislocations in this zone.

Figure 6C:
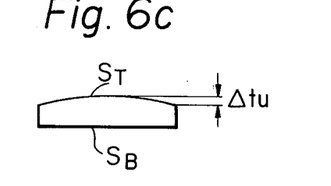
FIGS. 6c and 6d are sectional views of the resulting crystal ribbons.
Figure 6D:
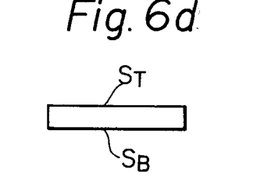

This process of the present invention can also be established by defining the front edge of the crystal growing domain with a straight line substantially perpendicular to the direction of the crystal growth. In this specific embodiment, the resultant crystal ribbon is as shown in FIG. 6a, i.e. it has flat surfaces. I case of the curved front edge including no concave therein, the resultant crystal ribbon has a curved surface, as shown in FIG. 6c. In this case the height $T_u$ is equal to the value of sine δ multiplied by the distance from the top of the front edge F to the end of the front edge $F_s$ ($T_u = F \, F_x \times$ sine δ).

It is to be understood that the effect of the contour of the back edge $B_{GI}$ is the same as that of the front edge F. That is, if the back edge is a straight line perpendicular to the pulling direction without a concave portion (this is established by adjusting the temperature distribution in the surface area of the melt surrounding the crystal growing domain above the melting point of the crystal, with heating means positioned above the melt (not shown)), then the bottom of the resulting crystal has a flat surface. Thus, the shape in section of the crystal ribbon being produced can easily be controlled by adjusting the contour in the horizontal plane of the crystal growing domain. Thus, a crystal ribbon without dislocations and having a flat surfaces on both sides is provided by the method of the present invention.

FIG. 3 (a and b) also shows the arrangement of the heating means 5, the heating surface of which is positioned substantially in parallel to the crystal growing interface and at a distance "h" of not more than 30 mm beneath the crystal growing interface. In the case shown in FIG. 3a, the back edge $B_{GI}$ is positioned inwardly apart from the edge of the crucible 3. Since the distance between the crystal growing interface and the heating surface of the heating means 5 is very short, the thermal conditions at and near the crystal growing interface can be controlled precisely.

In accordance with this embodiment of the invention as shown in FIG. 3 (a and b), the shape of the crystal growing domain may be formed precisely and uniformly due to the provision of the heating means a short distance beneath the interface resulting in successful high speed production of wide and thin crystal ribbons of high quality.

Namely, the provision of the heating means 5 beneath the crystal growing interface at a distance of not more than 30 mm brings about the following advantages: easy preparation of a relatively flat crystal growing interface at a predetermined position; a quick response to the change of thermal conditions occurring at the crystal growing interface; and precise control of heat from the heating mechanism.

What is claimed is:

1. A method of growing a thin single crystal semiconductor ribbon which comprises
    (a) producing a melt of a crystalline semiconductor substance in a container by heating said crystalline substance,
    (b) bringing a seed crystal into contact with said melt and pulling a thin single crystal semiconductor ribbon substantially laterally from said melt, said ribbon having the same crystal structure as said melt of said crystalline substance,
    (c) reducing the temperature in the surface area of the melt to a temperature below the melting point of the melt to form a supercooled layer by cooling said surface area with a gas blowing cooling means which extends over the melt for a given distance measured in the direction of pulling said ribbon, and
    (d) adjusting at least one of (i) said heating of said melt and (ii) the amount of said cooling, to produce a substantially wedge-shaped crystal growing domain located substantially completely under said cooling means and within said given distance, and having a length L from its front leading edge to its back edge B such that the ratio of said length L to the thickness of the resulting ribbon is not less then 50, and pulling said single crystal ribbon at a rate of at least 300 mm/min.

2. The method of claim 1, in which the ratio of the distance from the front edge to the back edge B of the crystal growing domain to the thickness of said crystal ribbon to is adjusted not less than 2000.

3. The method of claim 1, in which the crystal ribbon is pulled horizontally from the melt.

4. The method of claim 1, in which the crystal ribbon is pulled from the melt at an angle with respect to the horizontal melt surface.

5. The method of claim 1, in which the crystal ribbon is pulled from the melt with the position of the back edge B of the crystal growing domain located inside the line at which the crystallized ribbon is pulled away from the melt.

6. The method of claim 1, wherein the temperature of said surface area is so reduced by blowing an inert coolant gas downwardly onto said surface area.

7. The method of claim 6 further comprising passing said gas in the direction away from the pulling direction of the crystal ribbon.

8. The method of claim 6, wherein said inert coolant gas is blown from said cooling means located a predetermined distance above said surface area.

9. The method of claim 1, further comprising moving said cooling means in the direction away from the pulling direction to increase said length L of said crystal growing domain until said length L reaches a predetermined length.

10. The method of claim 1, wherein said thin crystal ribbon is a thin silicon ribbon.

11. A method of growing a thin single crystal semiconductor ribbon which comprises
    (a) producing a melt of a crystalline semiconductor substance in a container by heating said crystalline substance,
    (b) bringing a seed crystal into contact with said melt and pulling a thin single crystal semiconductor ribbon from an area of the melt inwardly and away from an edge of the container at an angle greater than zero but not greater than 10 degrees upwardly from the horizontal melt surface during a major portion of the pulling, said ribbon having the same crystal structure as said melt of said crystalline substance,
    (c) reducing the temperature in the surface area of the melt to a temperature below the melting point of the melt to form a supercooled layer by cooling said surface area with a gas blowing cooling means which extends over the melt for a given distance measured in the direction of pulling said ribbon, and (d) adjusting at least one of (i) said heating of said melt and (ii) the amount of said cooling, to produce a substantially wedge-shaped crystal growing domain located substantially completely under said cooling means and within said given distance, and having a length L from its front leading edge to its back edge B such that the ratio of said length L to the thickness of the resulting ribbons is not less than 50, and pulling said single crystal ribbon at a rate of at least 300 mm/min.

12. The method of claim 1, in which the crystal ribbon is initially pulled at an angle of not greater than 10 degrees upwardly from the horizontal melt surface and the pulling direction is gradually declined to the horizontal after the pulling rate reaches a predetermined level.

13. The method of claim 11, wherein the temperature of said surface area is so reduced by blowing an inert coolant gas downwardly onto said surface area.

14. The method of claim 13 further comprising passing said gas in the direction away from the pulling direction of the crystal ribbon.

15. The method of claim 14, wherein said inert coolant gas is blown from said cooling means located a predetermined distance above said surface area.

16. The method of claim 11, further comprising moving said cooling means in the direction away from the pulling direction to increase said length L of said crystal growing domain until said length L reaches a predetermined length.

17. The method of claim 11, wherein said thin crystal ribbon is a thin silicon ribbon.

18. A method of growing a thin single crystal semiconductor ribbon which comprises
(a) producing a melt of a crystalline semiconductor substance in a container by heating said crystalline substance,
(b) bringing a seed crystal into contact with said melt and pulling a single crystal semiconductor ribbon substantially laterally from said melt, said ribbon having the same crystal structure as said melt of said crystalline substance,
(c) reducing the temperature in the surface area of the melt to a temperature below the melting point of the melt to form a supercooled layer by cooling said surface area with a gas blowing cooling means which extends over the melt for a given distance measured in the direction of pulling said ribbon,
(d) adjusting at least one of (i) said heating of said melt and (ii) the amount of said cooling, to produce a substantially wedge-shaped crystal growing domain located substantially completely under said cooling means and within said given distance, and having a length L from its front leading edge to its back edge B such that the ratio of said length L to the thickness of the resulting ribbon is not less than 50, and pulling said single crystal ribbon at a rate of at least 300 mm/min., and
(e) adjusting the temperature distribution in the surface area of the melt surrounding the crystal growing domain to above the melting point of the crystal to control the contour of the front edge of the crystal growing domain to a shape in which there are no edge portions advanced in the crystal growth direction from any point on both sides of the front edge divided by the point thereof.

19. The method of claim 18, in which the contour of the front edge is a line which does not have therein any concave portion with respect to the crystal growth direction.

20. The method of claim 18, in which the crystal ribbon is pulled from an area of the melt inwardly and away from the edge of the container of the melt at an angle greater than zero but not greater than 10 degrees with respect to the horizontal melt surface during a major portion of the pulling.

21. The method of claim 18, wherein the temperature of said surface area is so reduced by blowing an inert coolant gas downwardly onto said surface area.

22. The method of claim 21 further comprising passing said gas in the direction away from the pulling direction of the crystal ribbon.

23. The method of claim 22, wherein said inert coolant gas is blown from said cooling means located a predetermined distance above said surface area.

24. The method of claim 18, further comprising moving said cooling means in the direction away from the pulling direction to increase said length L of said crystal growing domain until said length L reaches a predetermined length.

25. The method of claim 18, wherein said thin crystal ribbon is a thin silicon ribbon.

26. A method of growing a thin single crystal semiconductor ribbon which comprises
(a) producing a melt of a crystalline semiconductor substance in a container by heating said crystalline substance,
(b) bringing a seed crystal into contact with said melt and pulling a single crystal semiconductor ribbon substantially laterally from said melt, said ribbon having the same crystal structure as said melt of said crystalline substance,
(c) reducing the temperature in the surface area of the melt to a temperature below the melting point of the melt to form a supercooled layer by cooling said surface area with a gas blowing cooling means which extends over the melt for a given distance measured in the direction of pulling said ribbon, and
(d) heating the crystal growing interface with a heating means having a heating surface substantially parallel to the crystal growing interface and located beneath the crystal growing domain at a distance of not more than 30 mm, to produce a substantially wedge-shaped crystal growing domain located substantially completely under said cooling means and within said given distance, and having a length L from its front leading edge to its back edge B such that the ratio of said length L to the thickness of the resulting ribbon is not less than 50, and pulling said single crystal ribbon at a rate of at least 300 mm/min.

27. The method of claim 26, wherein the temperature of said surface area is so reduced by blowing an inert coolant gas downwardly onto said surface area.

28. The method of claim 27 further comprising passing said gas in the direction away from the pulling direction of the crystal ribbon.

29. The method of claim 28, wherein said inert coolant gas is low from said cooling means located a predetermined distance above said surface area.

30. The method of claim 26, further comprising moving said cooling means in the direction away from the pulling direction to increase said length L of said crystal growing domain until said length L reaches a predetermined length.

31. The method of claim 26, wherein said thin crystal ribbon is a thin silicon ribbon.

* * * * *

UNITED STATES PATENT AND TRADEMARK OFFICE
CERTIFICATE OF CORRECTION

PATENT NO. : 4,329,195
DATED : May 11, 1982
INVENTOR(S) : BOSSHI KUDO

It is certified that error appears in the above—identified patent and that said Letters Patent is hereby corrected as shown below:

Title page, left column, in the identification of Assignees
"Toyo Silicon Co., Ltd." should be --Japan Silicon Co., Ltd.--.

Column 15, line 13, (Claim 12), after "claim", "1" should
be --11--.

Signed and Sealed this

Ninth Day of November 1982

[SEAL]

Attest:

GERALD J. MOSSINGHOFF

Attesting Officer — Commissioner of Patents and Trademarks